United States Patent
Liu et al.

(10) Patent No.: US 9,373,071 B2
(45) Date of Patent: Jun. 21, 2016

(54) MULTILAYER WIRING TYPE DOUBLE-INTERFACE IC CARD ANTENNA MODULE

(71) Applicants: Beijing Basch Smartcard Co., Ltd., Beijing (CN); Caifeng Liu, Hangzhou, Zhejiang (CN); Qigang Lvqiu, Beijing (CN); Danning Wang, Beijing (CN)

(72) Inventors: Caifeng Liu, Zhejiang (CN); Zhongyu Wang, Zhejiang (CN); Qigang Lvqiu, Beijing (CN); Danning Wang, Beijing (CN)

(73) Assignee: Beijing Basch Smartcard Co., Ltd., Beijing (CN)

( * ) Notice: Subject to any disclaimer, the term of this patent is extended or adjusted under 35 U.S.C. 154(b) by 0 days.

(21) Appl. No.: 14/411,514

(22) PCT Filed: Jun. 28, 2013

(86) PCT No.: PCT/CN2013/078365
§ 371 (c)(1),
(2) Date: Dec. 28, 2014

(87) PCT Pub. No.: WO2014/000688
PCT Pub. Date: Jan. 3, 2014

(65) Prior Publication Data
US 2015/0161502 A1    Jun. 11, 2015

(30) Foreign Application Priority Data
Jun. 29, 2012 (CN) .......................... 2012 1 0226559

(51) Int. Cl.
*G06K 19/06* (2006.01)
*G06K 19/077* (2006.01)
(Continued)

(52) U.S. Cl.
CPC .... *G06K 19/07752* (2013.01); *G06K 19/07722* (2013.01); *G06K 19/07749* (2013.01); *G06K19/07754* (2013.01); *H05K 1/0326* (2013.01); *H05K 1/0386* (2013.01); *H05K 1/165* (2013.01); *H05K 3/4685* (2013.01); *H05K 2201/10098* (2013.01)

(58) Field of Classification Search
USPC ......................................................... 235/492
See application file for complete search history.

(56) References Cited

U.S. PATENT DOCUMENTS 8,981,906 B2 * 3/2015 Takeoka ............... H01Q 1/2225
235/435

FOREIGN PATENT DOCUMENTS

CN          102063631 A      5/2011
CN          102184443 A      9/2011
(Continued)

OTHER PUBLICATIONS

International Search Report (Chinese language), issued by the State Intellectual Property Office of the People's Republic of China, Sep. 19, 2013, for International Application No. PCT/CN2013/078365; 4 pages.

(Continued)

*Primary Examiner* — Jamara Franklin
(74) *Attorney, Agent, or Firm* — Faegre Baker Daniels LLP

(57) ABSTRACT

A multilayer wiring type dual-interface IC card antenna module includes: an electrode diaphragm layer, including an antenna and an electrode diaphragm; a clamping base layer including eight first through hole points right below eight metal contacts on the electrode diaphragm; an RFID antenna layer including an RFID antenna, a connecting contact, a first chip attaching point and a second chip attaching point; an insulation layer including eight second through hole points located right below the eight first through hole points, a third through hole point located right below the connecting contact, a fourth through hole point located right below the first chip attaching point, and a fifth through hole point located right below the second chip attaching point; and a bridge layer connected with the second chip attaching point and the connecting contact in a bridging manner. The antenna module can achieve full-automatic production.

10 Claims, 4 Drawing Sheets

(51) Int. Cl.
    *H05K 1/03*      (2006.01)
    *H05K 1/16*      (2006.01)
    *H05K 3/46*      (2006.01)

(56) References Cited

FOREIGN PATENT DOCUMENTS

| | | |
|---|---|---|
| CN | 102779286 A | 11/2012 |
| CN | 202815892 U | 3/2013 |
| EP | 2045763 B1 | 4/2012 |

OTHER PUBLICATIONS

English translation of the International Search Report, issued by the State Intellectual Property Office of the People's Republic of China, Sep. 19, 2013, for International Application No. PCT/CN2013/078365; 2 pages.

Written Opinion (Chinese language), issued by the State Intellectual Property Office of the People's Republic of China, Sep. 19, 2013, for International Application No. PCT/CN2013/078365; 4 pages.

* cited by examiner

MULTILAYER WIRING TYPE DOUBLE-INTERFACE IC CARD ANTENNA MODULE

This application is a national phase of International Application No. PCT/CN2013/078365, filed on Jun. 28, 2013, which claims priority to Chinese Patent Application No. 201210226559.7, entitled "MULTILAYER WIRING TYPE DOUBLE-INTERFACE IC CARD ANTENNA MODULE", filed with the Chinese Patent Office on Jun. 29, 2012, which is incorporated by reference in its entirety herein.

FIELD OF THE TECHNOLOGY

The disclosure relates to the field of integrated circuits and information interaction, particularly to an antenna module of a multilayer wiring dual-interface IC card.

BACKGROUND

A dual-interface card is a smart card providing both "contact" and "non-contact" interfaces with outside world based on a single chip on one IC card. The dual-interface card, in an appearance consistent with that of a contact IC card, has metal contacts complying with international standards, and the chip can be accessed via the contacts. The dual-interface card has an internal structure similar to that of a non-contact IC card, having radio frequency modules such as an antenna and a chip, and the chip can be accessed in a radio frequency fashion at a certain distance (within 10 cm). Therefore, the dual-interface card has two operational interfaces respectively complying with two different standards. The contact interface complies with standard ISO/IEC781.6. The non-contact interface complies with standard ISO/IEC115693, or standard ISO11784/ISO11785. The two interfaces share a same microprocessor, a same operation system and a same Electrically Erasable Programmable Read-Only Memory (EEPROM). Therefore, by integrating virtues of a contact IC card and a non-contact IC card, the dual-interface card is a multifunctional card having broad applicability. Especially, users who have already used a non-contact IC card system or a contact IC card system can upgrade their cards into a dual-interface IC card by merely modifying software, without replacing hardware devices such as system or machine. Direct settlement with banks can be carried out by using the dual-interface IC card in a public transport system such as a bus, urban rail transit, a taxi, and a ferry. Remote payments or settlement via banks can be achieved by using the dual-interface IC card in charging for urban living facilities such as a telephone, electricity, gas, and water. A more convenient way of payment, such as paying without stopping, can be achieved by using a dual-interface IC card reading system in a toll system of, for example, a highway, a road and bridge, a dock, harbor mooring, parking, or an entertainment place. The dual-interface IC card can also be used in trading areas of finance and securities, such as banking, postal services, telecommunications, securities trading, and consumption in shopping malls. The dual-interface IC card can also be used in an entry and exit management system such as appointment management, attendance management, and access control. The dual-interface IC card can also be used in an area of encrypted authentication, such as a SIM card of a mobile phone, an E-commerce transaction security certification card, an electronic funds transfer card, a software encryption card, an anti-counterfeit security card, and an anti-theft security card. Safe, reliable, convenient and quick operations can be realized by using the dual-interface IC card.

At present, a conventional fabrication method of a dual-interface IC card generally includes: connecting, in the dual-interface IC card, metal contacts of a chip with an electrode membrane; fabricating a wireless radio frequency identification antenna of a non-contact IC card; laminating the wireless radio frequency identification antenna into a card-base; slotting the card-base, at a place where the chip is to be packaged, where two ends of the wireless radio frequency identification antenna are exposed in the slot; embedding the chip of the dual-interface IC card into the slot of the card-base; contacting two metal contacts of the chip with the two ends of the wireless radio frequency identification antenna in the slot; and packaging the chip of the dual-interface IC card into the slot.

As shown in FIG. 1, conventionally, there is no antenna disposed on an electrode membrane. The chip of the dual-interface card is placed on the electrode membrane, where six among the eight metal contacts on the electrode membrane are used as contact type, and the other two contacts are used as non-contact type. The two ends of the antenna are connected with the two contacts used as the non-contact type. Currently, during conventional fabrication of the dual-interface IC card, the two ends of the antenna are connected with the two metal contacts in the way of fly wires which are soldered at the position of the contacts. In this method, manual soldering is needed in connecting the metal contacts with the ends of the wireless radio frequency identification antenna, causes slow speed, soldering joints prone to fall off, and poor stability. Furthermore, technology of the fabrication method is difficult and productivity is low, and the dual-interface IC card fabricated by the conventional fabrication method has a short lifetime and can not meet requirements of applications.

SUMMARY

In view of this, the disclosure aims mainly to provide an antenna module of a multilayer wiring dual-interface IC card, to solve the problems in the conventional technology that, manual soldering is needed to connect two ends of an antenna to two metal contacts on an electrode membrane in fabrication of a dual-interface IC card, soldering joints are prone to fall off, the stability is poor, and the productivity of the fabrication method is low.

In order to solve the above problems, technical solutions as follows are provided in the disclosure:

an antenna module of a multilayer wiring dual-interface IC card, includes: an electrode membrane layer, a card-base layer, a radio frequency identification RFID antenna layer, an insulating layer, and a bridge layer; where the electrode membrane layer includes an antenna and an electrode membrane;

the card-base layer is arranged below the electrode membrane layer and includes eight first through-holes, Where the eight first through-holes are located right below eight metal contacts on the electrode membrane;

the RFID antenna layer is arranged below the card-base layer and includes an RFID antenna, a connection contact, a first chip attachment point, and a second chip attachment point, where the connection contact and the first chip attachment point are respectively connected to two ends of the RFID antenna;

the insulating layer is arranged below the RFID antenna layer and includes eight second through-holes, a third through-hole, a fourth through-hole, and a fifth through-hole, where the eight second through-holes are located right below the eight first through-holes, the third through-hole is located right below the connection contact, the fourth through-hole is located right below the first chip attachment point, and the fifth through-hole is located right below the second chip attachment point; and the bridge layer is arranged below the insulating layer and includes a bridge, where the bridge connects the connection contact to the second chip attachment point.

Accordingly, the antenna, the RFID antenna and the bridge form a multilayer three-dimensional MD tag module.

Accordingly, the multilayer three-dimensional RFID tag module is a high frequency RFID tag module.

Accordingly, locations and sizes of the eight metal contacts on the electrode membrane comply with a smart card international standard ISO/IEC7816.

Accordingly, the antenna is arranged around the electrode membrane externally.

Accordingly, the RFID antenna is arranged around an edge of the RFID antenna layer.

Accordingly, the electrode membrane layer is metal with a certain thickness.

Accordingly, the electrode membrane layer, the card-base layer, and the RFID antenna layer are formed into an integral material covered with metal on both sides.

Accordingly, the electrode membrane layer, the card-base layer, the radio frequency identification RFID antenna layer, the insulating layer and the bridge layer are in a same size.

Accordingly, material of the card-base layer includes one or any combination of polyvinyl chloride PVC, polycarbonate PC, acrylonitrile-butadiene-styrene copolymers ABS, polyethylene terephthalate PET, poly(ethylene terephthalate-1,4-cylclohexane dimethylene terephthalate) PETG, and paper.

It may be seen from the above that the disclosure has advantages as follows:

The antenna module of the dual-interface IC card according to the disclosure is realized in a layered structure including an electrode membrane layer, a card-base layer, an RFID antenna layer, an insulating layer, and a bridge layer, therefore manual soldering can be avoided in connecting two ends of the antenna to two metal contacts on the electrode membrane, stability of the connections is improved, high quality and a long lifetime can be obtained, and requirements of users can be met. The card-base layer includes through-holes, and thereby a process of punching in modern technology can be avoided, and long fly wires in the insulating layer can be avoided. In addition, the fabrication is more convenient by using a printing method. The antenna module of the dual-interface IC card according to the disclosure can be produced in large scale full-automatic production with simple process and significantly improved speed.

DETAILED DESCRIPTION OF THE EMBODIMENTS

Figure 1:
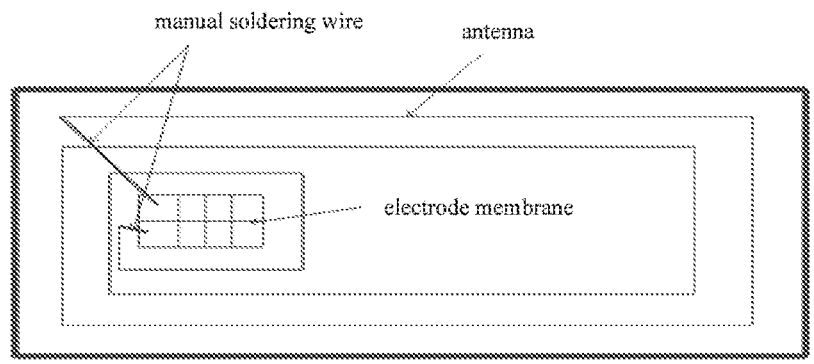
FIG. 1 is a diagram of connections between an antenna and an electrode membrane in a conventional dual-interface IC card.

For better understanding of the above purpose, features and virtues of the disclosure, embodiments of the disclosure are further described in detail in conjunction with drawings and embodiments.

In view of the problems in conventional technology that manual soldering is needed to connect two ends of an antenna to two metal contacts on an electrode membrane in fabrication of a dual-interface IC card, the soldering joints are prone to fall off, the stability is poor, and the productivity of the fabrication method is low, the embodiments of the disclosure are proposed.

An antenna module of a multilayer wiring dual-interface IC card is provided, including: an electrode membrane layer, a card-base layer, a radio frequency identification RFID antenna layer, an insulating layer, and a bridge layer; where the electrode membrane layer includes an antenna and an electrode membrane;

the card-base layer is arranged below the electrode membrane layer and includes eight first through-holes, where the eight first through-holes are located right below eight metal contacts on the electrode membrane;

the RFID antenna layer is arranged below the card-base layer and includes an RFID antenna, a connection contact, a first chip attachment point, and a second chip attachment point, where the connection contact and the first chip attachment point are respectively connected to two ends of the RFID antenna;

the insulating layer is arranged below the RFID antenna layer and includes eight second through-holes, a third through-hole, a fourth through-hole, and a fifth through-hole, where the eight second through-holes are located right below the eight first through-holes, the third through-hole is located right below the connection contact, the fourth through-hole is located right below the first chip attachment point, and the fifth through-hole is located right below the second chip attachment point; and the bridge layer is arranged below the insulating layer and includes a bridge, where the bridge connects the second chip attachment point to the connection contact.

In this way, the antenna module of the dual-interface IC card according to the disclosure is realized in a layered structure including an electrode membrane layer, a card-base layer, an RFID antenna layer, an insulating layer, and a bridge layer, therefore manual soldering can be avoided in connecting two ends of the antenna to two metal contacts on the electrode membrane, stability of the connections is improved, high quality and a long lifetime can be obtained, and requirements of users can be met. The card-base layer includes through-holes, and thereby a process of punching in modern technology can be avoided, and long fly wires in the insulating layer can be avoided. In addition, the fabrication is more convenient by using a printing method. The antenna module of the dual-interface IC card according to the disclosure can be produced in large scale full-automatic production with simple process and significantly improved speed.

The above is a core idea of the disclosure. In the following, technical solutions in embodiments of the disclosure are clearly and completely described in conjunction with the drawings. Apparently, the embodiments described are merely a few rather than all embodiments of the disclosure. Based on these embodiments, any other embodiment obtained without creative work by those skilled in the art is within the scope of the disclosure.

A lot of details are described in description below for convenience of fully understanding of the disclosure. However, the disclosure may also be implemented in other ways different from those described here. Similar inferences without departing from the connotation of the disclosure may be performed by those skilled in the art. Therefore, the disclosure is not limited by the embodiments disclosed below, Secondly; the disclosure is described in detail in combination with diagrams. In the detailed description of the disclosure, for convenience of description, structural diagrams and a sectional view of the antenna module of the dual-interface IC card are enlarged partially and are not drawn to scale. The drawings are exemplary and are not) intended to limit the scope of the disclosure. Furthermore, three dimensional spatial sizes of length, width, and depth should be included in practical fabrication.

An antenna module of a multilayer wiring dual-interface IC card is provided in the disclosure, including: an electrode membrane layer 1, a card-base layer 2, a radio frequency identification MID antenna layer 3, an insulating layer 4, and a bridge layer 5.

Figure 2:
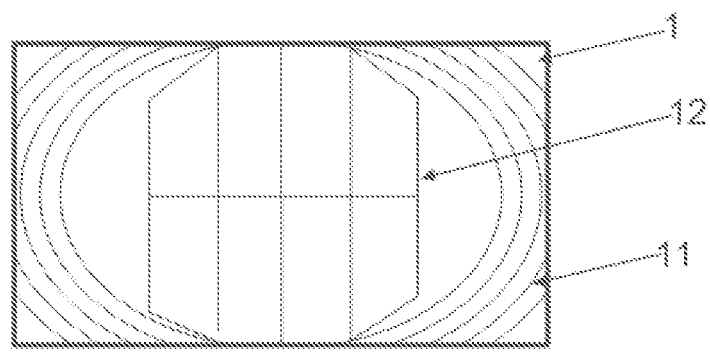
FIG. 2 is a structural diagram of an electrode membrane layer of an antenna module in a multilayer wiring dual-interface IC card according to the disclosure.

FIG. 2 is a structural diagram of the electrode membrane layer 1. The electrode membrane layer 1 includes an antenna 11 and an electrode membrane 12. The electrode membrane is configured for data transmission between the multilayer wiring dual-interface IC card and a reading and writing machine in a contacted manner. A size of the electrode membrane complies with a smart card international standard ISO/IEC7816. There are eight metal contacts on the electrode membrane. Locations and sizes of the eight metal contacts comply with the smart card international standard ISO/IEC7816. The antenna 11 surrounds the electrode membrane externally.

Figure 3:
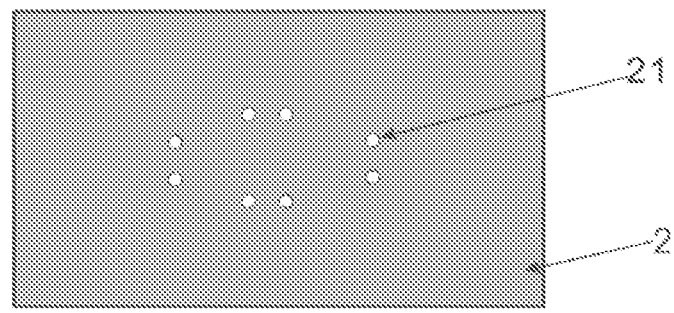
FIG. 3 is a structural diagram of a card-base layer of an antenna module in a multilayer wiring dual-interface IC card according to the disclosure.

FIG. 3 is a structural diagram of the card-base layer 2. The card-base layer 2 is arranged below the electrode membrane layer, and includes eight first through-holes 21. The eight first through-holes 21 are located right below the eight metal contacts on the electrode membrane in a way that the eight first through-holes and the eight metal contacts on the electrode membrane are disposed in one to one correspondence. The card-base layer is provided with full pattern except for the eight first through-holes.

Figure 4:
FIG. 4 is a structural diagram of an RFID antenna layer of an antenna module in a multilayer wiring dual-interface IC card according to the disclosure.

FIG. 4 is a structural diagram of the RFID antenna layer 3. The RFID antenna layer 3 is arranged below the card-base layer 2, and includes an RFID antenna 31, a connection contact 34, a first chip attachment point 32, and a second chip attachment point 33, The connection contact 34 and the first chip attachment point 32 are respectively connected to two ends of the RFID antenna 31. The RFID antenna layer is bare except for the RFID antenna 31, the connection contact 34, the first chip attachment point 32, and the second chip attachment point 33. The RFID antenna is arranged around an edge of the RFID antenna layer.

Figure 5:
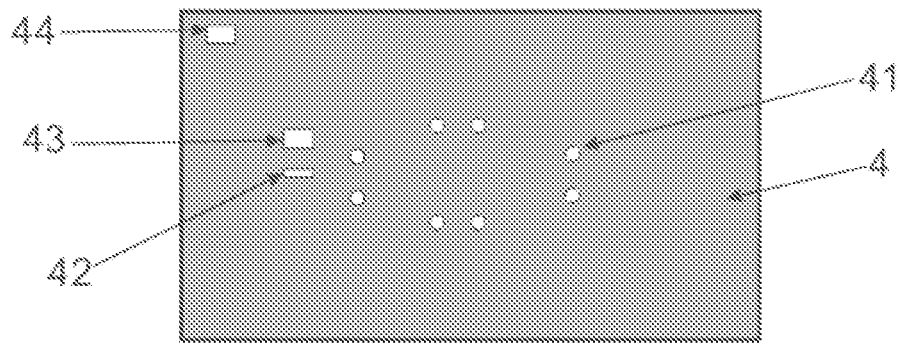
FIG. 5 is a structural diagram of an insulating layer of an antenna module in a multilayer wiring dual-interface IC card according to the disclosure.

FIG. 5 is a structural diagram of the insulating layer 4. The insulating layer 4 is arranged below the RFID antenna layer 3, and includes eight second through-holes 41, a third through-hole 44, a fourth through-hole 42, and a fifth through-hole 43. The eight second through-holes 41 are located right below the eight first through-holes 21 in a way that the eight second through-holes 41 and the eight first through-holes 21 are disposed in one to one correspondence. The third through-hole 44 is located right below the connection contact 34. The fourth through-hole 42 is located right below the first) chip attachment point 32. The fifth through-hole 43 is located right below the second chip attachment point 33. The insulating layer is provided with full pattern except for the eight second through-holes 41, the third through-hole 44, the fourth through-hole 42, and the fifth through-hole 43.

Figure 6:
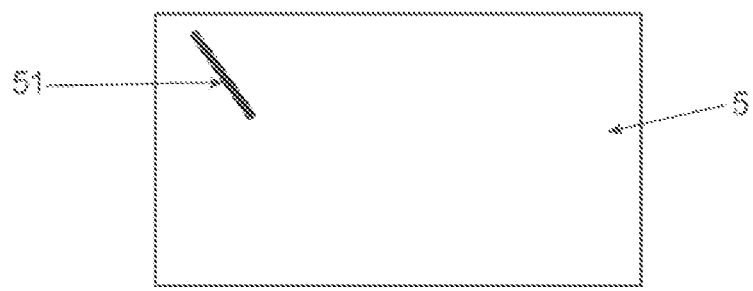
FIG. 6 is a structural diagram of a bridge layer of an antenna module in a multilayer wiring dual-interface IC card according to the disclosure.

FIG. 6 is a structural diagram of the bridge layer 5. The bridge layer 5 is arranged below the insulating layer 4, and includes a bridge 51. The bridge is a segment from a location of the second chip attachment point to a location of the connection contact, for connecting the second chip attachment point 33 with the connection contact 34.

Thus, with a layered structure of five layers including an electrode membrane layer, a card-base layer, an RFID antenna layer, an insulating layer, and a bridge layer, and by connecting the second chip attachment point and the connection contact via the bridge, the two ends of the antenna are connected to the two metal contacts on the electrode membrane in a simpler way.

Further, the antenna, the RFID antenna and the bridge may form a multilayer three-dimensional RFID tag module, to achieve non-contact access to the chip. The multilayer three-dimensional RFID tag module may be a high frequency RFID tag module. A frequency of the radio frequency identification tag may range in 3 MHz-30 MHz.

Figure 7:
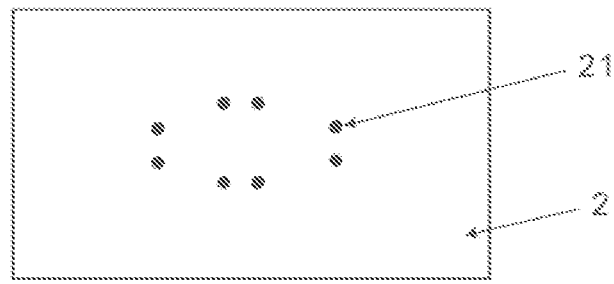
FIG. 7 is a diagram of a structure formed by covering an electrode membrane layer with a card-base layer in an antenna module according to the disclosure.

FIG. 7 is a diagram of a structure formed by covering an electrode membrane layer 1 with a card-base layer 2. A back surface of the electrode membrane layer 1 is covered with the card-base layer 2, thus the resultant structure includes the electrode membrane layer 1 at the front surface, and includes the card-base layer 2 at the back surface. The eight metal contacts on the electrode membrane 12 in the electrode membrane layer 1 can be directly connected to through the eight first through-holes 21 in the card-base layer 2.

Figure 8:
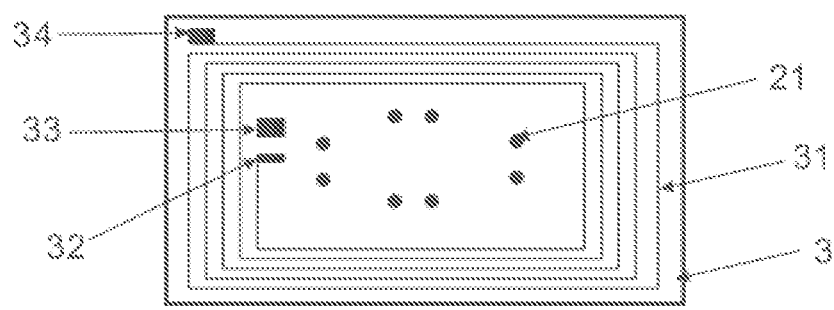
FIG. 8 is a diagram of a structure formed by covering a card-base layer with an RFID antenna layer in an antenna module according to the disclosure.

FIG. 8 is a diagram of a structure formed by covering the card-base layer 2 with an RFID antenna layer 3, based on FIG. 7. The exposed portion includes the RFID antenna coil 31, the connection contact 34, the first chip attachment point 32, and the second chip attachment point 33, as well as the eight metal contacts on the electrode membrane 12 in the electrode membrane layer 1, which can be directly accessed through the eight first through-holes 21 in the card-base layer 2, and a substrate of the card-base layer 2.

Figure 9:
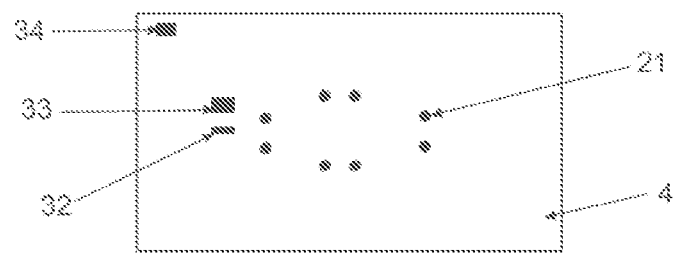
FIG. 9 is a diagram of a structure formed by covering an RFID antenna layer with an insulating layer according to the disclosure.

FIG. 9 is a diagram of a structure formed by covering the RFID antenna layer 3 with an insulating layer 4, based on FIG. 8. The exposed portion includes the RFID antenna coil 31, the connection contact 34, the first chip attachment point 32, and the second chip attachment point 33, as well as the eight metal contacts on the electrode membrane 12 in the electrode membrane layer 1, which can be directly accessed through the eight first through-holes 21 in the card-base layer 2.

Figure 10:
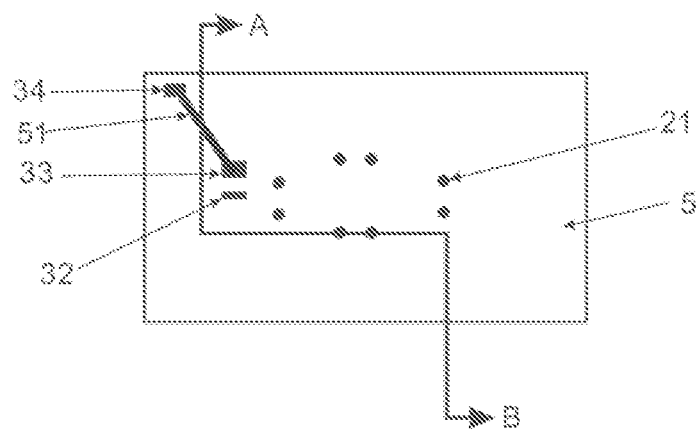
FIG. 10 is a diagram of a structure formed by covering an insulating layer with a bridge layer according to the disclosure.

FIG. 10 is a diagram of a structure formed by covering the insulating layer 4 with a bridge layer 5, based on FIG. 9. The connection contact 34 and the second chip attachment point 33 are connected by the bridge 51 of the bridge layer 5. By connecting the second chip attachment point to the connection contact through the bridge, which is equivalent to connecting the first chip attachment point and the second chip attachment point respectively to the two ends of the RFID antenna, and then connecting the chip with the first chip attachment point and the second chip attachment point, the connection is simple, and long fly wires are avoided.

Figure 11:
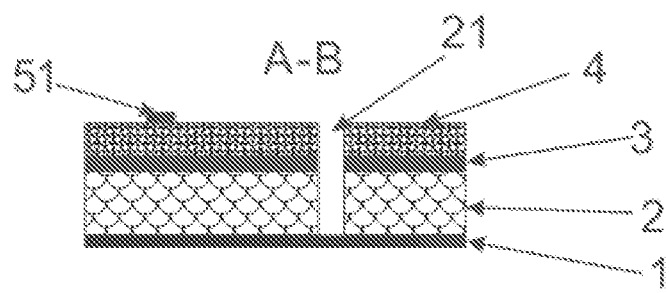
FIG. 11 is a sectional structural view of an antenna module in a multilayer wiring dual-interface IC card according to the disclosure.

FIG. 11 is a sectional structural view of the antenna module of the multilayer wiring dual-interface IC card according to the disclosure along A-B direction. The electrode membrane layer 1, the card-base layer 2, the RFID antenna layer 3, the insulating layer 4, and the bridge layer 5 are structured layer by layer, to form the antenna module of a multilayer wiring dual-interface IC card. One end of each of the eight first through-holes 21 may be connected to the air, and the other end reaches the electrode membrane layer.

In the above embodiments, the electrode membrane layer 1 may be formed by metal with a certain thickness.

The electrode membrane layer 1, the card-base layer 2, and the RFID antenna layer 3 may be formed collectively into an integral material covered with metal on both sides.

The electrode membrane layer 1, the card-base layer 2, the radio frequency identification RFID antenna layer 3, the insulating layer 4 and the bridge layer 5 are in the same size complying the smart card international standard ISO/IEC7816.

Material of the card-base layer 2 may include one or any combination of polyvinyl chloride PVC, polycarbonate PC, acrylonitrile-butadiene-styrene copolymers ABS, polyethylene terephthalate PET, poly(ethylene terephthalate-1,4-cylclohexane dimethylene terephthalate) PETG, and paper.

It is noted that the embodiments in the specification are described in a progressive manner, each of which emphasizes the differences from others, and the same or similar elements among the embodiments can be referred to each other.

It should be further noted that the relationship terminologies such as "first", "second" and the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, a process, method, article or device including a plurality of elements includes not only the elements but also other elements that are not enumerated, or also include the elements inherent for the process, method, article or device. Unless expressively limited otherwise, the statement "comprising (including) one . . . " does not exclude the case that other similar elements may exist in the process, method, article or device.

With the above description of the embodiments of the disclosure, the disclosure may be implemented or used by those skilled in the art. Various modifications to the embodiments are apparent to those skilled in the art, and the general principle defined in the disclosure may be implemented with other embodiments without departing from the spirit or scope of the disclosure. Therefore, the disclosure is not limited to the described embodiments, but claims a widest scope consistent with the principle and novel features of the disclosure.

The invention claimed is:

1. An antenna module of a multilayer wiring dual-interface card, comprising: an electrode membrane layer, a card-base layer, a radio frequency identification RFID antenna layer, an insulating layer, and a bridge layer; wherein the electrode membrane layer comprises an antenna and an electrode membrane;

the card-base layer is arranged below the electrode membrane layer and comprises eight first through-holes, wherein the eight first through-holes are located right below eight metal contacts on the electrode membrane;

the RFID antenna layer is arranged below the card-base layer and comprises an RFID antenna, a connection contact, a first chip attachment point, and a second chip attachment point, wherein the connection contact and the first chip attachment point are respectively connected to two ends of the RFID antenna;

the insulating layer is arranged below the RFID antenna layer and comprises eight second through-holes, a third through-hole, a fourth through-hole, and a fifth through-hole, wherein the eight second through-holes are located right below the eight first through-holes, the third through-hole is located right below the connection contact, the fourth through-hole is located right below the first chip attachment point, and the fifth through-hole is located right below the second chip attachment point; and the bridge layer is arranged below the insulating layer and comprises a bridge, wherein the bridge connects the connection contact to the second chip attachment point.

2. The antenna module according to claim 1, wherein the antenna, the RFID antenna and the bridge form a multilayer three-dimensional RFID tag module.

3. The antenna module according to claim 2, wherein the multilayer three-dimensional RFID tag module is a high frequency RFID tag module.

4. The antenna module according to claim 1, wherein locations and sizes of the eight metal contacts on the electrode membrane comply with smart card international standard ISO/IEC7816.

5. The antenna module according to claim 1, wherein the antenna is arranged around the electrode membrane externally.

6. The antenna module according to claim 1, wherein the RFID antenna is arranged around an edge of the RFID antenna layer.

7. The antenna module according to claim 1, wherein the electrode membrane layer is made of metal with a certain thickness.

8. The antenna module according to claim 1, wherein the electrode membrane layer, the card-base layer, and the RFID antenna layer are formed into an integral material covered with metal on both sides.

9. The antenna module according to claim 1, wherein the electrode membrane layer, the card-base layer, the radio frequency identification RFID antenna layer, the insulating layer and the bridge layer are in a same size.

10. The antenna module according to claim 1, wherein a material of the card-base layer comprises one or any combination of polyvinyl chloride PVC, polycarbonate PC, acrylonitrile-butadiene-styrene copolymers ABS, polyethylene terephthalate PET, poly(ethylene terephthalate-1,4-cylclohexane dimethylene terephthalate) PETG, and paper.

* * * * *